Figure 3:
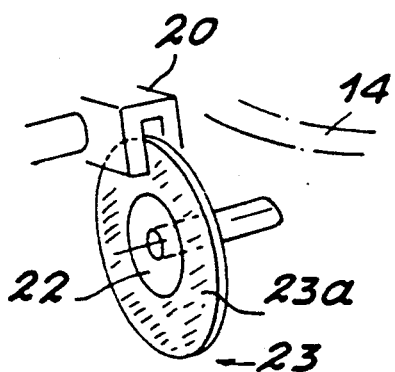

United States Patent [19]

Lamure et al.

[11] Patent Number: 5,084,624

[45] Date of Patent: Jan. 28, 1992

[54] APPARATUS FOR MAKING HOMOGENEOUS THE IMPLANTATION OF IONS ON THE SURFACE OF PLANAR SAMPLES

[75] Inventors: Jean M. Lamure, St Jean le Vieux; Jean F. Michaud, Montmelian, both of France

[73] Assignee: Commissariat a L'Energie Atomique, Paris, France

[21] Appl. No.: 672,324

[22] Filed: Mar. 20, 1991

[30] Foreign Application Priority Data

Mar. 23, 1990 [FR] France ................................ 90 03740

[51] Int. Cl.[5] .......................................... H01J 37/317
[52] U.S. Cl. ................................ 250/492.2; 250/442.1
[58] Field of Search ............... 250/492.21, 492.2, 442.1

[56] References Cited

U.S. PATENT DOCUMENTS 4,155,011  5/1979  Märk ............................... 250/492.21
4,733,087  3/1988  Narita et al. ..................... 250/492.21

FOREIGN PATENT DOCUMENTS 2191335  12/1987  United Kingdom .

OTHER PUBLICATIONS

Patent Abstracts of Japan, vol. 13, No. 571 (E-862) (3919). 11/18/1989 & JP-A-1 239 747 (Nissin Electric Co. Ltd.) 12/25/1989.
Patent Abstracts of Japan, vol. 9, No. 193 (E-334) (1916) 9/08/1985 & JP-A-6 059 646 (Hitachi Seisakusho K.K.) 6/04/1985.
Patent Abstracts of Japan, vol. 11, No. 367 (E-561) (2814) 11/28/1987 & JP-A-62 139 241 (Hitachi Seisakusho K.K.) 06/22/1987.

Primary Examiner—Jack I. Berman
Attorney, Agent, or Firm—Cesari and McKenna

[57] ABSTRACT

Apparatus for making homogeneous the implantation of ions on the surface of planar samples placed on supports distributed within a rotary drum. Preferably magnetic means for rotating these supports make it possible to bring the samples beneath the ion beam with different angles during each revolution of the drum and thus prevent problems associated with the channelling of the ions in the samples.

8 Claims, 2 Drawing Sheets

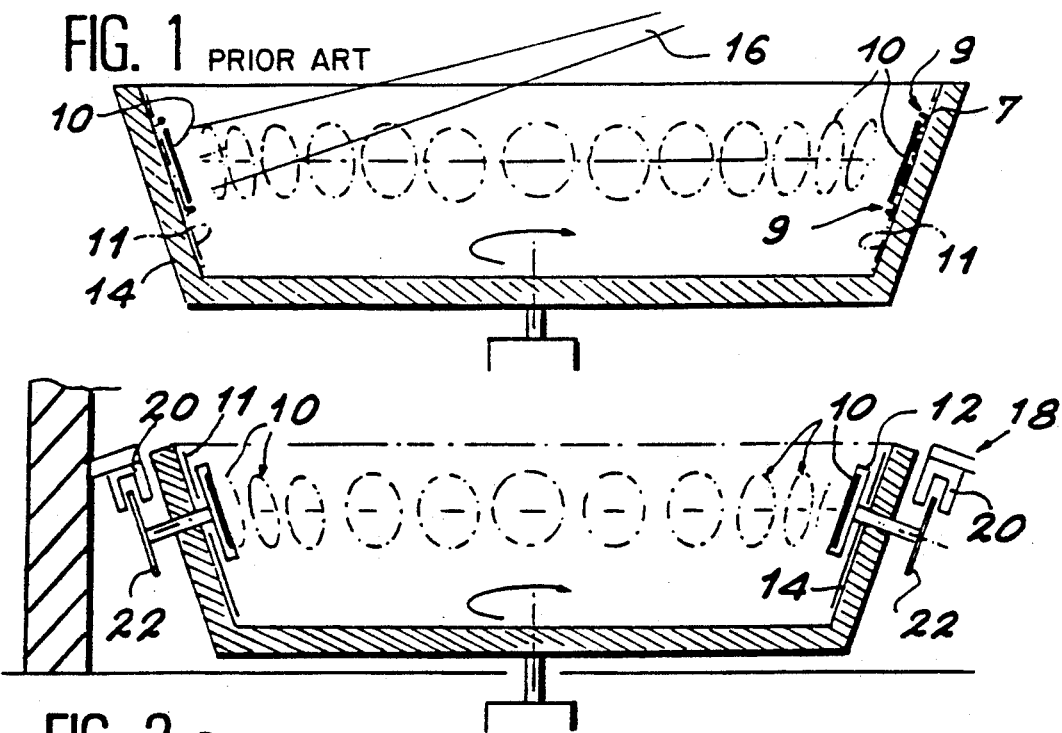
FIG. 1 PRIOR ART
FIG. 2 a
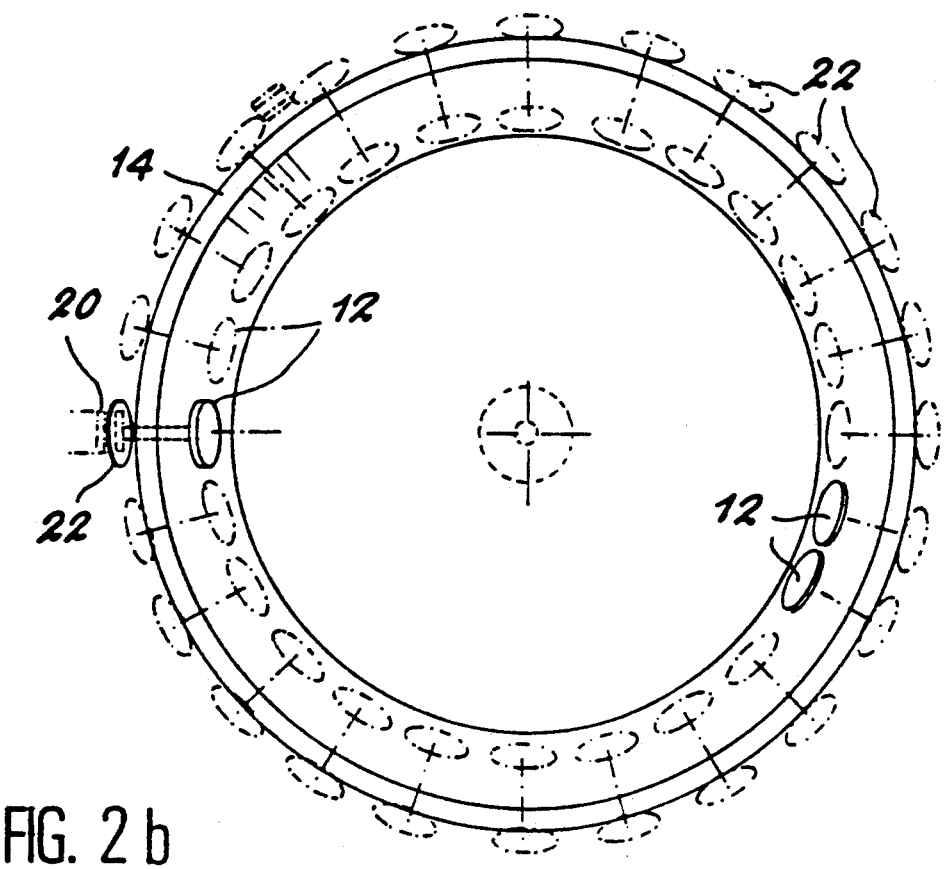
FIG. 2 b

APPARATUS FOR MAKING HOMOGENEOUS THE IMPLANTATION OF IONS ON THE SURFACE OF PLANAR SAMPLES

DESCRIPTION

The present invention relates to an apparatus for making homogeneous the implantation of ions on the surface of planar samples. It is more particularly used in the microelectronics field for insulating a surface layer of a semiconductor material wafer.

Integrated circuits are generally produced from semiconductor wafers, on whose surface are created, by etching, deposition and doping operations, the active zones of the circuits, the interconnections and the necessary insulation.

For certain applications, a surface portion of the semiconductor wafers must be insulated over a certain thickness from the remainder of the substrate. In the case of a silicon wafer, said insulating layer can be obtained by implanting oxygen ions ($O^+$) through the surface of the wafer, followed by high temperature annealing. Therefore the insulating layer is of silicon oxide.

The uniformity of the $O^+$ ion dose received by the surface of the semiconductor wafer constitutes one of the main criteria characterizing the quality of the product obtained.

The U.S. company EATON markets under the reference NV200, an ion implanter making it possible to treat 20 to 25 wafers at once. Such a known apparatus is shown in FIG. 1.

The semiconductor wafers 10 are held by e.g. quartz pins 9 on a protective silicon layer 11 covering the inner face 7 of a drum or rotary member 14, whose rotation speed can be between 100 and 1000 r.p.m. The wafers 10 travel in front of an elliptical $O^+$ ion beam 16, whose large dimension is larger than the diameter of the wafers 10.

The angle of incidence of the beam 16 on the wafers and the orientation of the latter are chosen in such a way that the path of the ions implanted in the silicon crystal does not correspond to channelling paths. Thus, this correspondence would give rise to significant implantation depth variations.

In known manner, in order to improve the implantation of the ions carried out by an apparatus of the type shown in FIG. 1, the section of the beam is reduced and the latter is subject to a vertical scan during the rotation of the drum.

In this case, the result obtained is very good, because the implantation dose variations are less than $\pm 1\%$. Unfortunately, the method consisting of scanning a reduced section ion beam involves numerous disadvantages:

a) The amplitude of the scan must be such that the ion beam passes completely out of the wafer, in order that the dose remains uniform over the entire surface. This leads to dead times (during which the beam is outside the wafer) and a significant loss of ions. These phenomena are generally compensated by applying a more intense beam, which leads to heating, which is prejudicial to the quality of the semiconductor material and causes supplementary pollution risks.

b) The scan is created by varying a current passing through an electromagnetic. The intensity of this current, which is close to 100 A, only permits a low scanning speed (corresponding to approximately one outward and return movement in 5 seconds) leading to significant temperature differences between the different points on the wafers. In order to compensate this local heating, additional heating is supplied during implantation, but defects are still created in the semiconductor material.

c) The use of a scanned, focussed ion beam and the modifications associated therewith makes the apparatus much more expensive.

The present invention makes it possible to obtain just as good and if not better dose uniformities than the focussed ion beam scanning apparatuses without suffering from the disadvantages thereof. For this purpose, the invention recommends rotating each support with respect to an axis perpendicular to the inner surface of the drum. This movement is superimposed on the rotation of the drum. A wafer positioned in a support is rotated, which permits an identical ion implantation distribution over the entire surface. This prevents any scanning of the beam and the associated disadvantages.

More specifically, the present invention relates to an apparatus for making homogeneous the implantation of ions on the surface of planar samples comprising a rotary member in the form of a drum or disk, sample supports distributed over a face of the rotary member and means for rotating the supports.

In a preferred manner, the rotary means for the supports comprise a means for creating a magnetic field, drive disks, each of these disks being integral with a support, one end of the said disks being immersed in the said magnetic field and rotary spindles traversing the rotary member, each of the said spindles holding a drive disk at one of its ends and a support at the other.

The magnetic drive makes it possible to reduce to a minimum the pollution-generating mechanical contacts.

In a preferred embodiment, the means for creating a magnetic field is constituted by at least one magnet having an air gap suitable for a contact-free passage of the ends of the drive disks.

Advantageously, the means for creating a magnetic field is constituted by magnets placed over a fraction of a ring surrounding the rotary member and each having an air gap suitable for the contact-free passage of the ends of the drive disks.

The number of magnets is determined in such a way that the momentum supplied to the conductive material drive disks is adequate for the samples to be placed under the ion beam with different angles for each revolution of the drum.

This construction makes it possible to quasi-continuously rotate the supports without having to have supplementary energy supplies. Thus, use is made of the kinetic rotary energy of the drum for moving the supports.

In addition, shocks and possible friction between the mechanical parts are limited to the maximum, so as to avoid any pollution of the samples.

Such an apparatus can easily function at the temperatures reached in the chamber containing the semiconductor wafers or samples (said temperatures reaching 700° C.).

As a function of the particular embodiments, the drive disk can have several different shapes and can be flat, substantially conical or even convex. The drive disks are made from a material sensitive to a magnetic field.

According to a special embodiment, the drive disks are made from a conductive material.

According to another special embodiment, the drive disks are made from a fritted magnetic material.

According to another embodiment, the drive disks are provided with drive means made from a material sensitive to a magnetic field. These means can e.g. be a fritted magnetic material ring connected to the circumference of each disk. Advantageously, each drive disk is provided with selective positioning means.

According to a special embodiment, these selective positioning means comprise a fixed magnetized material part and at least one pin which can be magnetized and fixed to the drive disk, so as to face the magnetized material during the rotation of the drive disk.

In a preferred manner, several pins are distributed over a circle centred on the centre of the drive disk, so as to decelerate the rotation of the disk during their passage in front of the magnetized material. The choice of the position of the pins makes it possible to ensure that the silicon wafer does not appear beneath the ion beam according to certain angles during the rotation of the support. This reduces the problems associated with the channelling of ions in the silicon monocrystal.

The characteristics and advantages of the invention can be gathered from the following description of a non-limitative embodiment relative to the attached drawings, wherein show:

FIG. 1, already described and relating to the prior art, diagrammatically a partial view of an apparatus for implanting ion on the surface of planar samples.

FIGS. 2a and 2b diagrammatically a sectional view (FIG. 2a) and a plan view (FIG. 2b) of an apparatus according to the invention.

FIG. 3: Diagrammatically a constructional variant of a drive disk according to the invention.

Figure 4:
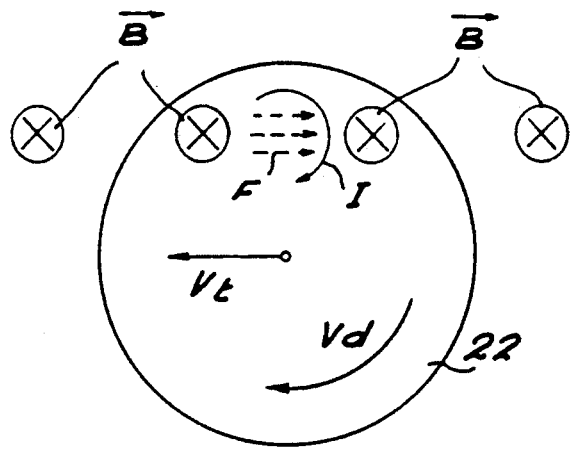

FIG. 4: Diagrammatically the currents and forces used in a magnetic drive system according to the invention.

Figure 5:
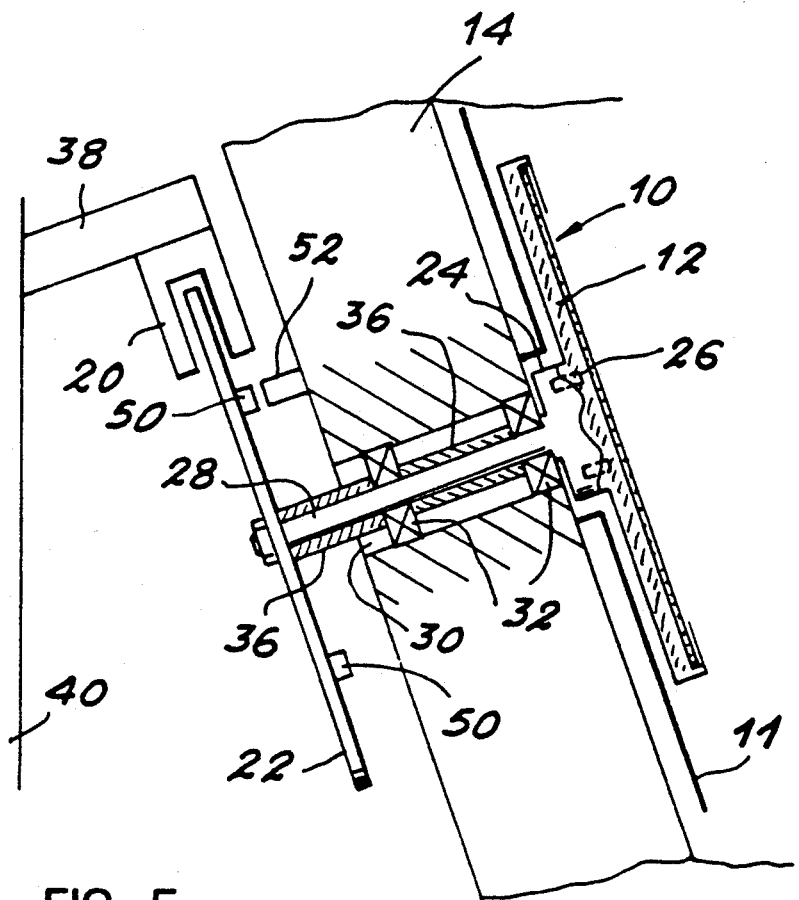

FIG. 5: Diagrammatically a part sectional view of an apparatus according to the invention.

With reference to FIGS. 2a and 2b, it can be seen that the rotary member 14, in this case the drum, of an apparatus for the implantation of ions of the type described hereinbefore is equipped, according to the invention, with means for rotating the supports 12. These means are constituted by a means 18 for creating a magnetic field surrounding part of the drum 14 and by disks 22 made from a material sensitive to a magnetic field, such as a conductive, amagnetic material, e.g. aluminum, or a fritted magnetic material. These disks are integral with supports 12 and are located outside the drum 14 in such a way that one end of each disk is immersed in the magnetic field and preferably perpendicular to the latter.

As can also be seen in FIGS. 2a and 2b, the magnetic field is created between the air gaps of magnets 20 arranged in ring-like manner around part of the drum 14.

FIG. 3 shows a constructional variant of a drive disk 22, which is made from an amagnetic material and has on its periphery drive means 23 made from a material sensitive to a magnetic field. These means e.g. have a fritted magnetic material ring 23a, which is such that it is immersed in the magnetic field during the rotation of the drum. The rotation of the conductive disks 22 will now be described with reference to FIG. 4.

FIG. 4 shows a disk 22 driven by the not shown drum 14 so as to rotate about the axis of said drum at a speed indicated by an arrow Vt. The upper end of the disk 22 is immersed in the magnetic field distribution $\vec{B}$ and is substantially perpendicular to said field during the rotation of the drum 14.

Under these conditions, it is known that eddy currents symbolized by an arrow I induce a force field symbolized by a broken line arrow F, which opposes the movement of the disk 22 about the rotation spindle or axis of the drum and which therefore drives, by reaction, the disk 22 in such a way that it rotates about its own axis. This movement is symbolized by an arrow Vd. Each disk 22 is integral with a support 12, so that the latter are rotated about the axes or spindles of the disks 22.

FIG. 5 is a diagrammatic, part sectional view of an apparatus according to the invention and explains the rotary system linked with each support.

A planar sample 10 is placed on a support 12. The said sample is normally a diameter 75 to 200 mm, 300 to 800 micrometer thick silicon wafer. The support 12 has dimensions appropriate for the sample 10. It can e.g. be made from quartz or any other material resisting temperatures of approximately 300° to 700° C., which do not contaminate the sample and are able to resist the ion bombardment. It can be in the form of a hollowed out disk, a crosspiece or any other shape adapted to the holding of the sample during rotations.

The support 12 is fixed to an intermediate part 24, e.g. of aluminum or stainless steel. It is centred on the said part 24 by pins 26, e.g. of aluminum, or stainless steel, or quartz, or some other material resisting the temperature in question and not contaminating the sample.

A spindle 28 traverses the drum 14 perpendicular to the latter. It is integral with an intermediate part 24 at its end within the drum 14. At its other end outside the drum 14, it is fixed to the centre of a drive disk 22.

The spindle 28 passes through the drum 14 by an opening 30 provided for this purpose. It is kept fixed to the drum 14 by a pair of ballbearings 32 or any other adequate fixing means. A spacer 36 ensures the distribution of the elements linked with the spindle 28. The latter is e.g. made from stainless steel or any other material ensuring the rigidity of the rotary assembly (support and disk) and which is resistant to heat and oxidation.

As has been shown hereinbefore, the drive disk 22, because it has one end immersed in an adequate magnetic field, ensures the rotary movement which is transmitted to the support 12 via the spindle 28.

The disk has a diameter resulting from a compromise between the overall dimensions, the weight and the torque obtained, e.g. 100 mm and has a thickness of e.g. 2 mm. In FIG. 5 the drive disk is flat.

One end of the disk 22 is immersed in the magnetic field directed perpendicular to the plane of the disk created within the air gap of an e.g. U-shaped magnet 20. The air gap (between the branches of the U of the magnet) has an adequate spacing to permit the passage of the drive disk 22 and prevent any metallic contact therewith during the rotations about the rotary axis of the drum and the spindle 28. The magnet 28 can be a permanent magnet or an electromagnet.

Other magnets 20 (not visible in FIG. 4) are distributed over part of the drum 14 in such a way that the disk 22 has a quasi-continuous rotary movement about the spindle 28. For information only, there are 16 magnets with a 3 mm reciprocal spacing distributed over part of the ring around an approximately 1 m diameter drum.

In the embodiment shown in FIG. 5, each magnet 20 is supported by a tab 38 fixed to the chamber wall 40 in which the drum 14 is installed. This tab is e.g. made from an aluminum alloy and makes it possible to position the magnets so as to create a magnetic field distribution perpendicular to the plane of the drive disk 22.

The disk 22 in FIG. 5 is provided with selective positioning means, which reduces the channelling effect, by minimizing the exposure time under certain angles.

These selective positioning means comprise on the one hand a magnet 52 fixed to the drum 14 and on the other hand pins 50 fixed to the disk 22 and made from a material sensitive to the magnetic field, e.g. mild steel. The e.g. 8 pins 50 are distributed over a circle centred on the centre of the disk 22 and are positioned so as to face the magnet 52 during the rotation of the disk 22.

The system then has priviledged position angles corresponding to a pin 50 facing a pole of the magnet 52.

The rotation of the sample makes it possible to obtain a uniform distribution of the ions and prevent channelling problems. An apparatus according to the invention is economic and non-polluting. The rotation is magnetic and utilizes the rotary energy of the drum.

The apparatus according to the invention is simple, rapid to dismantle and reinstall, which facilitates the regular cleaning operations necessary for the elements in the implantation chamber.

Obviously, the invention is not limited to the embodiment of an apparatus having a drum and in fact extends to any apparatus having a rotary member with a shape chosen from among cones, disks, pyramids, cylinders, plates, etc. and carrying the semiconductor wafers to be treated.

We claim:

1. Apparatus for making homogeneous the implantation of ions on the surface of planar samples (10) having a rotary member (14), sample supports (12) distributed over one face of the rotary member (14) and means for rotating the supports (12), while having a means (18) for creating a magnetic field, rotation spindles (28) transversing the rotary member (14), each of the spindles (28) holding a drive disk (22) at one of its ends and a support (12) at the other, while one end of each of the drive disk (22) is immersed in said magnetic field during the rotation of the rotary member (14), the rotation of said rotary member (14) leading to the rotation of the drive disks (22) exposed to the magnetic field.

2. Apparatus according to claim 1, wherein the means (18) for creating a magnetic field is constituted by at least one magnet (20) having an air gap suitable for the contact-free passage of the ends of the drive disks (22).

3. Apparatus according to claim 1, wherein the drive disks (22) are made from a material sensitive to a magnetic field.

4. Apparatus according to claim 3, wherein the drive disks (22) are made from a conductive material.

5. Apparatus according to claim 3, wherein the drive disks (22) are made from a fritted magnetic material.

6. Apparatus according to claim 3, wherein the drive disks (22) are provided with drive means (23) made from a material sensitive to a magnetic field.

7. Apparatus according to claim 1, wherein each drive disk (22) is provided with selective positioning means (50, 52).

8. Apparatus according to claim 7, wherein the selective positioning means incorporate a fixed magnetized material part (52) and at least one pin (50) which can be magnetized and fixed to the drive disk (22), so that it is positioned facing the magnetized material part (52) during the rotation of the drive disk (22).

* * * * *